United States Patent
Fuller et al.

(10) Patent No.: US 6,969,914 B2
(45) Date of Patent: Nov. 29, 2005

(54) ELECTRONIC DEVICE PACKAGE

(75) Inventors: Jason L. Fuller, Meridian, ID (US); Frank L. Hall, Boise, ID (US); Tongbi Jiang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 280 days.

(21) Appl. No.: 10/233,262

(22) Filed: Aug. 29, 2002

(65) Prior Publication Data

US 2004/0041279 A1 Mar. 4, 2004

(51) Int. Cl.[7] .......................... H01L 23/48; H01L 23/52; H01L 29/40
(52) U.S. Cl. ...................... 257/780; 257/783
(58) Field of Search ................ 257/780, 781, 257/783

(56) References Cited

U.S. PATENT DOCUMENTS

| | | | |
|---|---|---|---|
| 5,679,977 A | 10/1997 | Khandros et al. | 257/692 |
| 5,681,757 A * | 10/1997 | Hayes | 257/778 |
| 5,852,326 A | 12/1998 | Khandros et al. | 257/692 |
| 6,108,210 A * | 8/2000 | Chung | 361/747 |
| 6,121,689 A * | 9/2000 | Capote et al. | 257/783 |
| 6,228,548 B1 | 5/2001 | King et al. | 430/106 |
| 6,238,223 B1 * | 5/2001 | Cobbley et al. | 439/119 |
| 6,259,036 B1 * | 7/2001 | Farnworth | 174/260 |
| 6,271,599 B1 | 8/2001 | Agarwala et al. | 257/782 |
| 6,281,450 B1 | 8/2001 | Urasaki et al. | 174/261 |
| 6,288,905 B1 * | 9/2001 | Chung | 361/771 |
| 6,388,339 B1 | 5/2002 | Yamamoto et al. | 257/787 |
| 6,426,564 B1 | 7/2002 | Ball | 257/783 |
| 6,576,495 B1 | 6/2003 | Jiang et al. | 438/108 |
| 6,765,652 B1 | 7/2004 | Jiang | 355/405 |
| 6,784,024 B2 | 8/2004 | Jiang | 438/118 |
| 2002/0025602 A1 | 2/2002 | Tonghi et al. | 438/108 |

OTHER PUBLICATIONS

"Advanced Underfill Encapsulant–T693/R3002EX–V3", *Product Data*, (Oct. 2000), pp. 1–5.

"Nagase Chemtex Corp", *Material Safety Data Sheet*, Trade Name T693/R5003,(Jun. 1, 2000), pp. 1–5.

* cited by examiner

*Primary Examiner*—S. V. Clark
(74) *Attorney, Agent, or Firm*—Schwegman, Lundberg, Woessner & Kluth, P.A.

(57) ABSTRACT

An electronic device package is described that includes a non-metal die attached adhesive. The die attach is positioned in discrete positions on a surface to which the die will be fixed. The die is placed on the discrete die attach. The die attach, in an embodiment, is an epoxy resin or other material that is cured. After curing, the die is electrically connected to an external circuit. The volume between the die and surface is filled with an underfill. In an embodiment, underfill cross-links with the die attach.

115 Claims, 11 Drawing Sheets

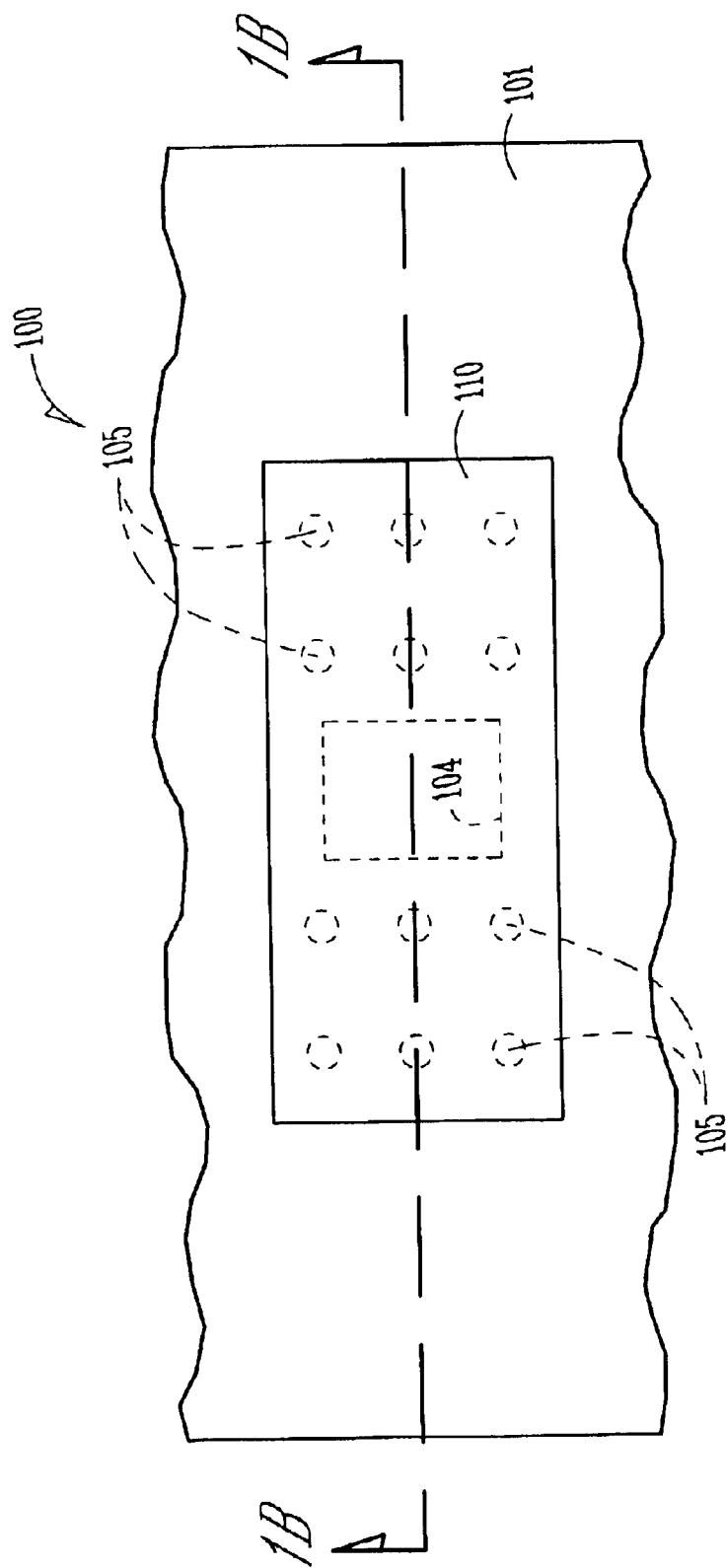

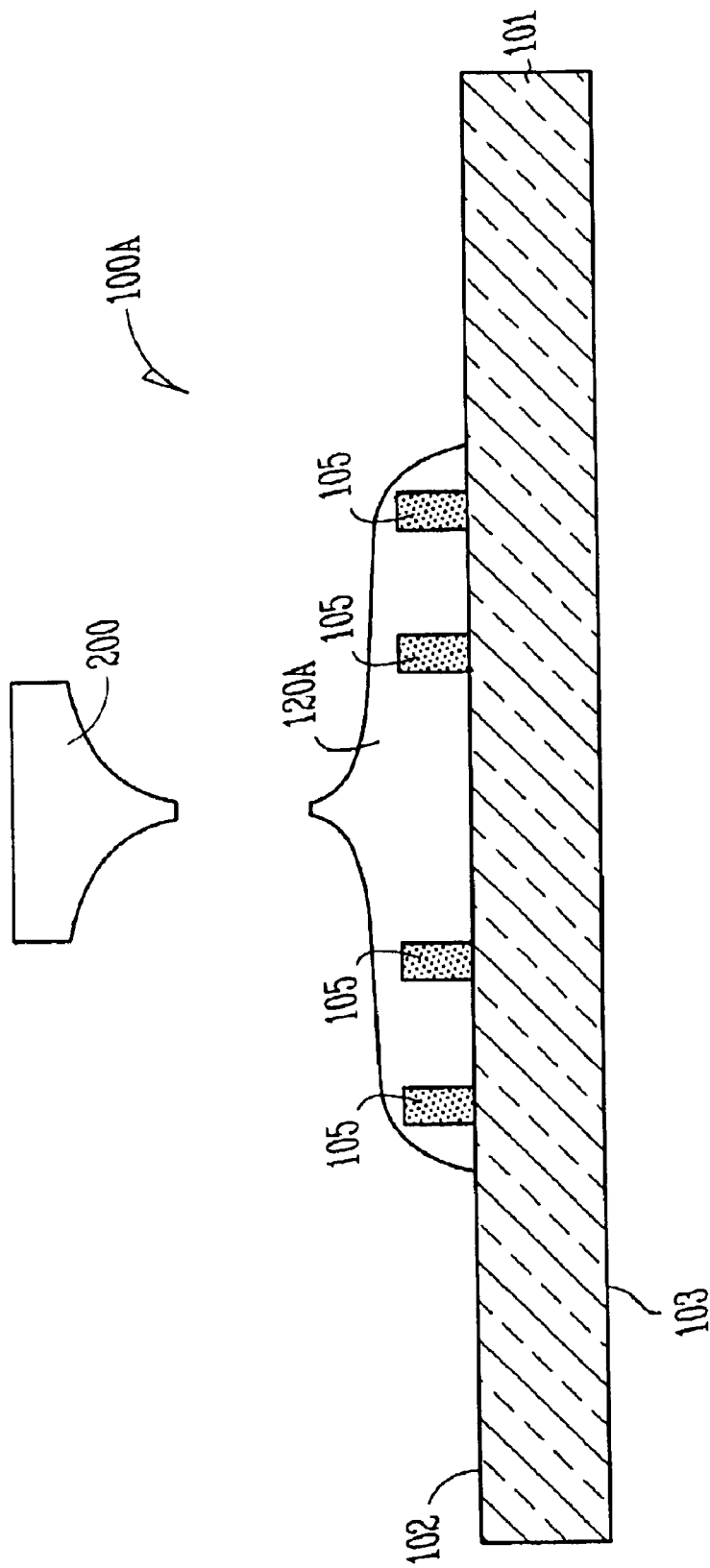

ELECTRONIC DEVICE PACKAGE

FIELD OF THE INVENTION

This invention relates to packaging, and more particularly to packaging electronic devices.

BACKGROUND OF THE INVENTION

Electronic devices, such as integrated circuit dice, are packaged using a variety of materials. For example, plastics, ceramics, and glasses are used as substrates and die carriers, while adhesives and polymers are used to attach dice to substrates or other die carriers. Patent Application Publication No. US 2002/0025602A1 describes a microelectronic assembly with a pre-disposed fill material and associated method of manufacture and is hereby incorporated by reference. This publication describes attaching a microelectronic die to a substrate using solder balls that fix to solder ball pads to form solder joints. Thus, a metal is used to connect the die and substrate. Underfill fills the void between the die and substrate adjacent the solder balls. Underfill improves the structural integrity of a die/substrate assembly. For example, underfill reduces the effects of global thermal expansion mismatch between the die and substrate. That is, underfill reduces the stress and strain on the solder joints. Underfill further protects the chip from moisture, ionic contaminants, and mechanical stresses such as twist, pull, shear, and shock/vibration. Accordingly, the bond between the die and substrate includes at least two materials.

U.S. Pat. No. 5,679,977 and U.S. Pat. No. 5,852,326 teach that attaching a die to a substrate using a material having a low Young's modulus produces fewer package failures than attaching a die to a substrate using a material having a high Young's modulus, and that improved packaging reliability is obtained by selecting a die attachment material having a very low Young's modulus.

U.S. Pat. No. 6,426,564 describes a system for attaching a plurality of solder balls to an electronic device that includes a heat-resistant tape having a first side comprising a plurality of recesses. The first side of the tape may form an adhesive surface. The recesses are located for registration with a plurality of connection points on the electronic device. The recesses are each adapted to receive and retain a solder ball therein. After placing a solder ball within two or more of the recesses, the first side of the tape may be adhered to the electronic device with the solder balls retained therein. Heating of the solder balls causes them to reflow and adhere to the connection points. After cooling, the tape may be removed, wherein the solder balls remain bonded to the connection points, forming a Ball Grid Array (BGA).

SUMMARY OF THE INVENTION

The above mentioned problems with electronic device packages and other problems are addressed by the present invention and will be understood by reading and studying the following specification. An electronic device package is described that includes a die attachment material that is adapted to attach a die to a substrate.

The subject matter of the present application provides, in an embodiment, an electronic package including a substrate and a plurality of adhesive bumps on the substrate. A die is received on the adhesive bumps. The adhesive bumps fix the die to the substrate. The plurality of adhesive bumps stand upright from a surface of the substrate and separate the die from the substrate. In an embodiment, the plurality of adhesive bumps includes a high viscosity adhesive material. In an embodiment, the plurality of adhesive bumps includes an epoxy resin. In an embodiment, the plurality of adhesive bumps contact a small fraction of the die surface area.

The subject matter of the present invention provides, in an embodiment, a substrate, a plurality of adhesive bumps on the substrate, and a die on the plurality of adhesive bumps and spaced from the substrate. An underfill material in positioned in the space between the substrate and the die. In an embodiment, the underfill material includes a epoxy encapsulant. In an embodiment, the underfill material has a lower viscosity than the plurality of adhesive bumps. In an embodiment, the underfill material includes a Young's modulus that is an order of magnitude greater than the Young's modulus of the plurality of adhesive bumps. In an embodiment, the underfill material cross-links to the plurality of adhesive bumps. In an embodiment, the underfill material connects to the plurality of adhesive bumps to form a continuous material layer between the substrate and the die. In an embodiment, the underfill material includes 1,6-Bis(2,3-epoxypropoxy) naphthalene; methyl hexahydrophthalic anhydride; silica; and carbon black.

The present subject matter invention also provides, in embodiments, methods of fabricating an electronic package as described above. In an embodiment, the method includes placing a plurality of adhesive bumps on the substrate, placing the die on the adhesive bumps, and curing the adhesive bumps. In an embodiment, placing the die on the adhesive bumps occurs before curing the adhesive bumps. In an embodiment, the method includes filling a gap between the substrate and die with an underfill material. In an embodiment, the method includes placing the epoxy resin includes depositing the epoxy resin in discrete units on the substrate. In an embodiment, depositing the epoxy resin includes covering less than 25% of the surface area of the substrate with epoxy resin. In an embodiment, the method includes cross-linking the underfill material to the adhesive bumps. In an embodiment, the method includes electrically connecting the die to the substrate. In an embodiment, the method includes encapsulating the die in a molding material.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

FIG. 1F is a plan of an electronic package according to the present invention;

FIG. 2A is cross sectional view another embodiment of an electronic package of the present invention;

DETAILED DESCRIPTION OF THE PREFERRED EMBODIMENTS

In the following detailed description of the embodiments, reference is made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The following detailed description is, therefore, not to be taken in a limiting sense, and the scope of the present invention is defined only by the appended claims and their equivalents.

Figure 1A:
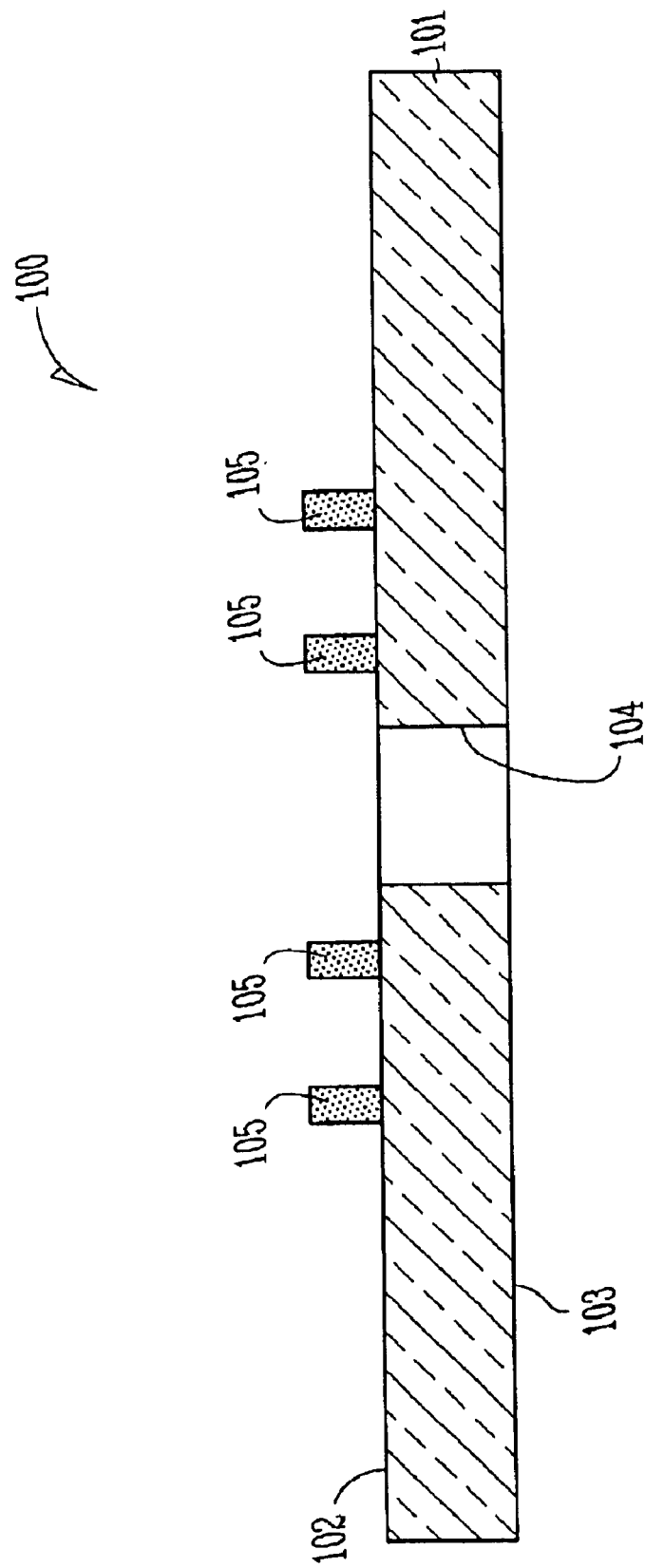
FIG. 1A is a cross-sectional view of an electronic package according to the present invention.

FIG. 1A shows an embodiment of electronic package 100 during fabrication according to the present invention. Electronic package 100 includes a substrate 101 that is adapted to support a die and has an upper surface 102 and a lower surface 103. A slot 104 is positioned in the substrate 101 and extends from upper surface 102 to lower surface 103. A plurality of adhesive bumps 105 are patterned on substrate upper surface 102. Adhesive bumps 105 are volumes of adhesive material that stand upraised from substrate upper surface 102. Adhesive bumps 105 are adapted to fix a die to the substrate. At least one bump 105 is deposited on both sides of slot 104. In an embodiment, at least two bumps 105 are positioned on each side of slot 104. In an embodiment, bump(s) 105 are pillars or columns that are upright from the substrate upper surface.

In the present invention, substrate 101 is not limited to a particular material or a particular structure. Substrate 101, in an embodiment, is fabricated from a flexible material. Substrate 101, in an embodiment, is fabricated from an inflexible (rigid) material. In an embodiment, substrate 101 is fabricated from a chemically inert material. Exemplary embodiments of substrates suitable for use in connection with the present invention include single metal layer substrates, multi-metal layer substrates, printed circuit board (PCB) substrates, such as organic, glass fiber reinforced and ceramic substrates, and flexible substrates. Other exemplary embodiments of substrates suitable for use in connection with the present invention include multilayer substrates, such as multilayer BT epoxy substrates having signal, power, and ground layers.

Adhesive bumps 105 are formed of an epoxy resin. In an embodiment, adhesive bumps 105 are formed from a high viscosity material. In an embodiment, adhesive bumps 105 have a viscosity of greater than about 100,000 cps (at room temp, using 5 rpm spindle speed). In an embodiment, adhesive bumps 105 have a viscosity of greater than about 250,000 cps. In an embodiment, the viscosity is in the range of 100,000–500,000 cps (at room temp, using 5 rpm spindle speed). The thixotropic index (defined as viscosity at 0.5 rpm divided by viscosity at 5 rpm) is greater than about 4. In an embodiment, the thixotropic index is in range of 4–7. Examples of epoxy resins include those epoxy resins formed from 1,6-Bis(2,3-epoxypropoxy) naphthalene; methyl hexahydrophthalic anhydride; silica; and carbon black. The adhesive bumps 105 are die attach material that provide a structure for mechanically securing die 110 to substrate 101. Preferably, die attach material, e.g., adhesive bumps 105, maintains contact with both die 110 and substrate 101 during and after further processing of the package 100. One example of further processing is a solder reflow process, which in one embodiment occurs at between about 200 degrees Centigrade and about 280 degrees Centigrade. To maintain contact with die 110, die attach material 105 should not peel away from the surface of substrate 110 and should not deform during the solder reflow process. According to the present invention, a die attach material having a high Young's modulus provides a more reliable structure than a die attach material having a low Young's modulus. According to the present invention, die attach material 105 having a high Young's modulus provides a more reliable structure than a die attach material having a low Young's modulus. In an embodiment, die attach material 105 has a low coefficient of thermal expansion. For example, in one embodiment, die attach material 209 has a $\alpha_2$ of less than about 400 (four-hundred) ppm (parts per million)/° C. $\alpha_2$ is defined as coefficient of thermal expansion at temperature above $T_g$, the glassy transition temperature. Materials that are suitable for use in connection with the present invention include epoxy resins.

As used herein, "epoxy resin" refers to a polymeric resin with terminal epoxy groups. The epoxy resin is typically formed from oxiranes. The oxiranes employed to form the epoxy resin, via a polymerization reaction, can be the same or different. When the oxirane monomers are different, the resulting epoxy resin will be a copolymer. As used herein, a "copolymer" is a mixed polymer or heteropolymer formed when two or more unlike monomers (e.g., the oxirane monomers) are polymerized together. *Concise Chemical and Technical Dictionary*; 4th Ed.; Chemical Publishing Co., Inc., NY, N.Y. (1986), p. 336.

In one embodiment of the present invention, each of the oxirane monomers are identical. In another embodiment of the present invention, all of the oxirane monomers are not identical (i.e., the epoxy polymer is an epoxy copolymer). In such an embodiment, the number of different oxirane monomers can be from 2 to about 1,000, from 2 to about 100, or from 2 to about 10.

In one specific embodiment of the present invention, the epoxy resin can be a mixture of two or more epoxy resins, as defined above. The mixture can include 2 to about 100 epoxy resins, 2 to about 50 epoxy resins, or 2 to about 10 epoxy resins.

As used herein, an "oxirane" refers to a cyclic organic compound having an oxygen atom bonded to two other atoms, preferably carbon. Suitable oxiranes are disclosed, e.g., in *Concise Chemical and Technical Dictionary*; 4th Ed.; Chemical Publishing Co., Inc., NY, N.Y. (1986); *Aldrich Catalog Handbook of Fine Chemicals*, Milwaukee, Wis. (1999); the disclosures of which are incorporated by reference herein.

As used herein, "epoxy" refers to a diradical of an oxirane.

A specific oxirane employed to form the epoxy resin can be a compound of formula (I):

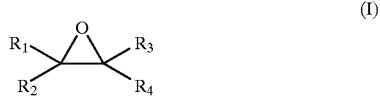

(I)

wherein each of $R_1$, $R_2$, $R_3$, and $R_4$ is independently hydrogen, halo, trifluoromethyl, cyano, hydroxy, nitro, $(C_1-C_{24})$alkyl, $(C_2-C_{24})$alkenyl, $(C_2-C_{24})$alkynyl, $(C_3-C_8)$cycloalkyl, $(C_1-C_{24})$alkyl $(C_3-C_8)$cycloalkyl, $(C_6-C_{10})$aryl, $(C_6-C_{10})$heteroaryl, $(C_1-C_{24})$alkyl $(C_6-C_{10})$aryl, $(C_1-C_{24})$alkyl $(C_6-C_{10})$heteroaryl, $(C_6-C_{10})$aryl $(C_1-C_{24})$alkyl, $(C_6-C_{10})$heteroaryl $(C_1-C_{24})$alkyl, or $(C_3-C_8)$cycloalkyl $(C_1-C_{24})$alkyl;

wherein any alkyl, alkenyl, alkynyl, cycloalkyl, aryl, or heteroaryl can optionally be substituted with one or more (e.g., 1, 2, 3, or 4) $(C_1-C_{24})$alkoxy, epoxy $(C_1-C_{24})$alkyl, epoxy $(C_1-C_{24})$alkoxy, halo, trifluoromethyl, cyano, hydroxy, nitro, $C(=O)OR_6$, wherein $R_6$ is hydrogen or $(C_1-C_{24})$alkyl, or $NR_7R_8$, wherein each $R_7$ and $R_8$ are independently hydrogen or $(C_1-C_{24})$alkyl; and wherein any alkyl, alkenyl, or alkynyl is optionally interrupted with one or more (e.g., 1, 2, 3, or 4) oxo, thio, sulfonyl, or sulfinyl;

or a suitable salt thereof.

Specifically, $R_1$ can be aryl oxy $(C_1-C_{24})$alkyl, wherein the aryl is substituted with epoxy $(C_1-C_{24})$alkoxy.

More specifically, $R_1$ can be

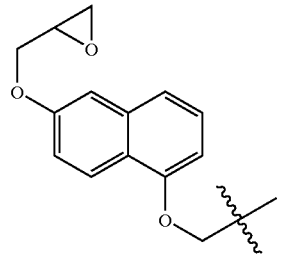

Specifically, $R_2$ can be hydrogen.
Specifically, $R_3$ can be hydrogen.
Specifically, $R_4$ can be hydrogen.

A specific oxirane employed to form the epoxy resin can be oxirane 2,2'-(1,6-naphthalenediylbis(oxymethylene))bis- or 1,6-Bis(2,3-epoxypropoxy) naphthalene, having a CAS Registry Number of 27610-48-6, and is shown below:

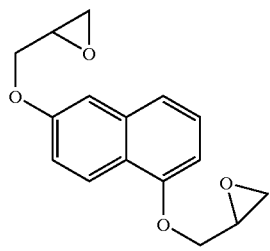

In one specific embodiment of the present invention, the epoxy resin can be formed from one or more oxiranes. It is appreciated that those of skill in the art understand the reaction conditions in which oxiranes can be polymerized to form epoxy resins. See, e.g., J. March, *Advanced Organic Chemistry, Reactions, Mechanisms and Structure*, (2nd Ed.), McGraw Hill: New York, 1977; F. Carey and R. Sundberg, *Advanced Organic Chemistry, Part B: Reactions and Synthesis*, (2nd Ed.), Plenum: New York, 1977; and references cited therein; which are incorporated by reference herein. For example, the one or more oxiranes can be polymerized under basic or acidic conditions.

The polymerization of the one or more oxiranes to form the epoxy resin can include materials or compounds that will impart desirable properties to the epoxy resin (e.g., a solidifier) or that will catalyze the polymerization process. For example, bisphenol A, bisphenol F, methyl hexahydrophthalic anhydride, silica, carbon black, and/or CTBN can be employed in the polymerization process.

The number of monomers in the epoxy resin that is formed from the oxirane can range from 2 to about 1,000,000; from 2 to about 100,000; from 2 to about 50,000 or 2 to about 10,000.

The epoxy resin can be formed (i.e., cured) at room temperature. Alternatively, the epoxy resin can be formed (i.e., cured) at an elevated temperature, an elevated pressure, or a combination thereof. Additionally, the epoxy resin can be formed (i.e., cured) via the use of radiant energy (e.g., UV, electron beam, microwave, beta radiation, gamma radiation, neutron beam, proton beam, infra red, etc.).

As used herein, "elevated temperature" refers to any temperature above room temperature, 77° F. (25° C.). Typically, the elevated temperature can be above about 100° C. (212° F.), above about 150° C. (302° F.), above about 200° C. (392° F.), or up to about 250° C. (482° F.). Specifically, the elevated temperature can be about 77° F. (25° C.) to about 315° C. (599° F.), about 100° C. (212° F.) to about 315° C. (599° F.), about 77° F. (25° C.) to about 218° C. (425° F.), about 100° C. (212° F.) to about 218° C. (425° F.), or about 175° C. (374° F.) to about 218° C. (425° F.).

As used herein, "elevated pressure" refers to any pressure above standard pressure, 1 atm. (14.7 psi). Typically, the elevated pressure can be up to about 5.0 atm (73.5 psi), up to about 10.0 atm (146.9 psi), or up to about 20.0 atm (293.9 psi). Specifically, the elevated pressure can be about 1 atm. (14.7 psi) to about 5.0 atm (73.5 psi).

Figure 1B:
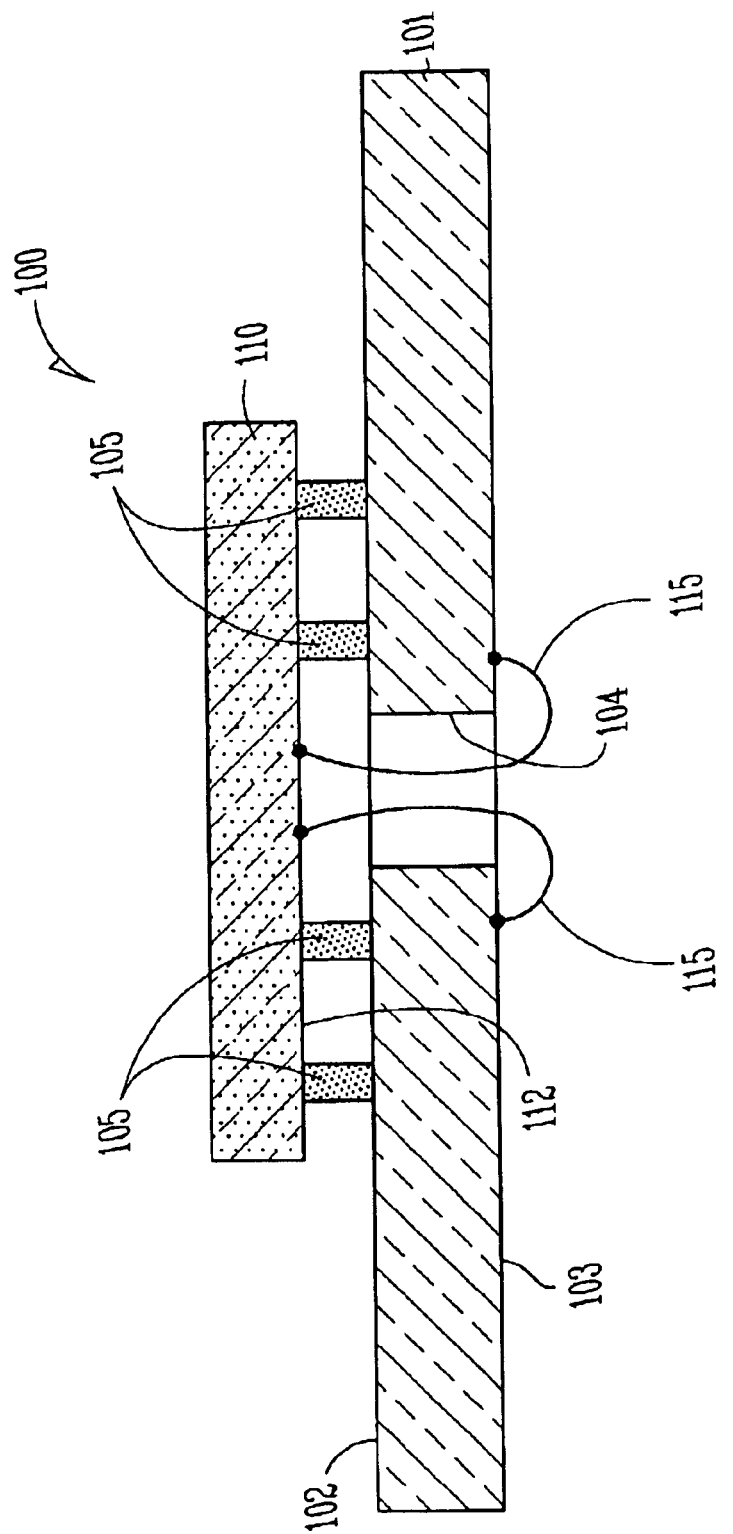
FIG. 1B is a cross-sectional view of an electronic package according to the present invention.

FIG. 1B shows an embodiment of electronic package 100 during fabrication according to the present invention. A die 110 is placed on the top of adhesive bumps 105 such that a void 112 is formed between opposed surfaces of die 110 and substrate 101. The adhesive bumps 105 have a high viscosity and thus support the die 110 without substantially deforming. That is, the adhesive bumps are viscous enough to support the weight of die 110 without substantially spreading. In an embodiment, adhesive bumps 105 are upright supports that are formed from a material used as a dam for liquid encapsulation materials Void 112 is a gap between the opposed surfaces of the die that is generally equal in height to the height of the adhesive bumps 105. Substrate 101 provides a base for mounting die 110.

In an embodiment, die 110 is fabricated from a semiconductor, such as silicon, germanium, or gallium arsenide. In an embodiment of the present invention, die 110 includes one or more processor circuits, such as a reduced instruction set processor or a complex instruction set processor. In an embodiment, die 110 includes one or more communication circuits, such as a transmitter, receiver, or transceiver. In an embodiment, die 110 includes one or more memory circuits or cells, such as dynamic random access memory circuits or cells, or static random access memory circuits or cells. Each of the circuits, cells, processors, communication devices or other complex systems fabricated on die 110 are, in an embodiment, fabricated from passive and active integrated circuit devices, such as resistors, capacitors, inductors, transistors, and diodes. Die 110 is thus adapted to compute or store electronic data. Die 110 further includes input/output terminals to import or export electrical signals. Wire bonds 115 are attached at one end to an I/O terminal of die 110 and at another end to a terminal on substrate 101. In an embodiment, at least one terminal is a bond pad. The wire bonds 115 are adapted to electrically couple conductors of the die 110 to electrical conductors of substrate 101. In an embodiment, electrical conductors of the die include integrated circuits. In an embodiment, electrical conductors of the substrate 101 include traces and conducting lines. The die, in embodiments of the present invention, includes silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art.

The adhesive bumps 105 are cured to fix the die 110 to the substrate 101. Adhesive bumps 115 are adapted to fix die 110 to substrate 101 during the wire bonding steps, e.g., fixing one end of bond wire 115 to a die contact and fixing a second end of bond wire 115 to a substrate contact. In an embodiment, curing includes heating the assembly 100 to harden the adhesive material of bumps 105. In an embodiment, curing includes waiting a period of time for the polymerization of the epoxy components. The curing process is a chemical reaction in which the epoxide groups in epoxy resin react with a curing agent (hardener) to form a highly crosslinked, three-dimensional network. In order to convert epoxy resins into a hard, infusible, and rigid material, it is necessary to cure the resin with hardener. Epoxy resins cure quickly and easily at practically any temperature from 5–150 degrees Celsius depending on the choice of curing agent. The curing of the adhesive bumps 105 provides a structurally secure assembly of the die 110 to substrate 101. In an embodiment, assembly 100 does not have structural metal interconnects between the die 110 and the substrate 101. That is, there are no solder connection between the die 110 and substrate 101. In an embodiment, assembly 100 includes both solder (not shown) and adhesive bump 105 connections.

Figure 1C:
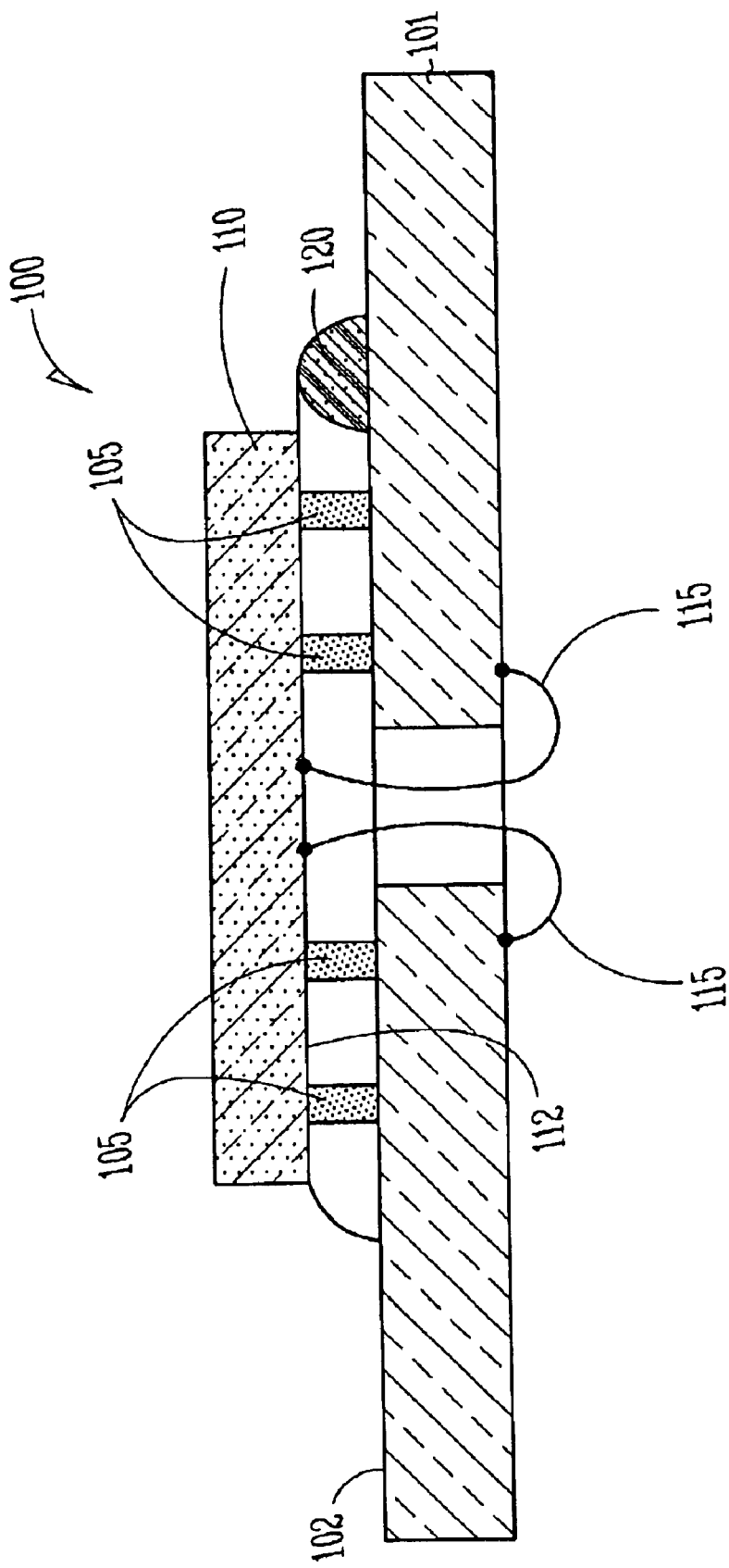
FIG. 1C is a cross-sectional view of an electronic package according to the present invention.

FIG. 1C shows an embodiment of electronic package 100 during fabrication according to the present invention. An underfill material 120, which is adapted to introduced into void 112 between die 110 and substrate 101, connects the die and the substrate. In an embodiment, a bead of flowable epoxy underfill material 120 is positioned on the substrate 101 along two edges of the die 110. As shown in FIG. 1C, the bead of underfill material 120 extends along the right side and back side of the die on the substrate. Underfill material 120 is heated until it flows and fills the void 112 by capillary action. However, the underfill is not heated to such a temperature that the underfill will cure before it flow into gap 112. In an embodiment, the underfill and assembly 100 is heated to a temperature in a range of about 40 degrees Celsius to about 90 degrees Celsius. The underfill 120 includes an epoxy resin. Underfill material 120 accordingly protects connections from oxides and other contaminants. Further, underfill material 120 increases the rate at which heat is transferred away from the die 110. The underfill material 120 also increases the mechanical strength of the connection between the die 110 and the substrate 120 to keep the package 100 intact during environmental temperature changes, despite the fact that die 110, the solder balls (not shown), if any, and substrate 120 generally have different coefficients of thermal expansion. The underfill material 120 has a lower viscosity than the adhesive bumps 105. In an embodiment, underfill material 120 has a viscosity of about 2,800 mPa s at 25 degrees Celsius.

Figure 1D:
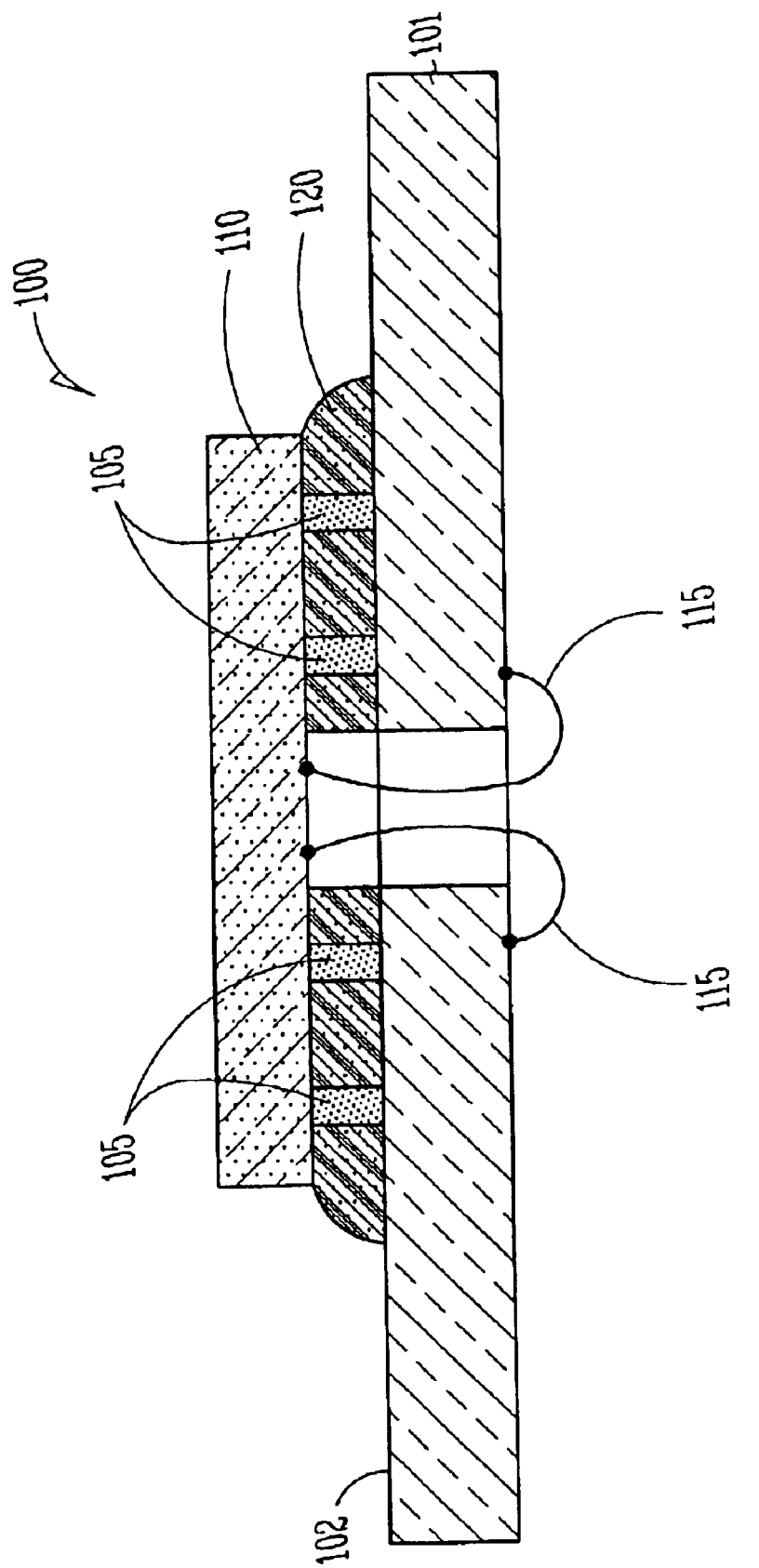
FIG. 1D is a cross-sectional view of an electronic package according to the present invention.

FIG. 1D shows an embodiment of electronic package 100 during fabrication according to the present invention. Underfill material 120 has flowed into gap 112 between die 110 and substrate 101. Underfill material 120 substantially fills gap 112 and contacts the lower die surface and the upper substrate surface. Underfill 120 further contacts adhesive bumps 105. In an embodiment, adhesive bumps 105 and underfill 120 cross-link. Cross-linking forms an essentially homogenous material filling the gap between the die and the substrate. In an embodiment, the die adhesive and underfill form a continuous layer between the die and substrate.

Figure 1E:
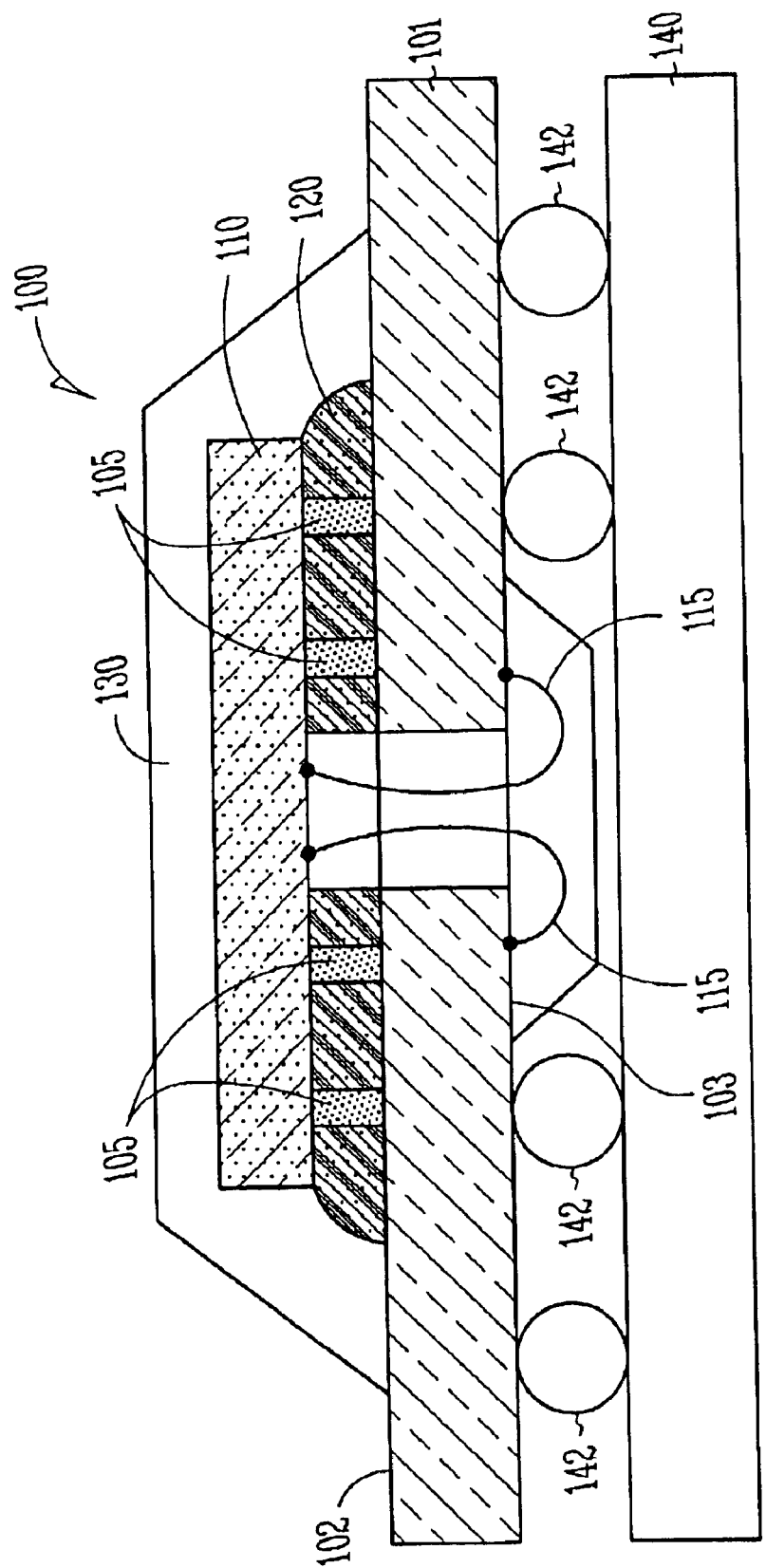
FIG. 1E is a cross-sectional view of an electronic package according to the present invention.

FIG. 1E shows an embodiment of electronic package 100 during fabrication according to the present invention. A mold compound 130 encases the die 110, bonding wires 115 and die attach compound such as die adhesive bumps 105 and underfill 120. The mold compound 130 protects the die and its connection from the environment.

Board 140 provides a base for mounting substrate 101. In addition, board 140 can provide a base for mounting additional substrates (not shown). Board 140 is not limited to being fabricated from a particular material. In an embodiment, board 140 is fabricated from an inert material that has a coefficient of thermal expansion about equal to the coefficient of thermal expansion of substrate 101. In one embodiment, board 140 is fabricated from a ceramic. In an alternate embodiment, board 140 is fabricated from a glass-epoxy resin. In still another embodiment, board 140 is fabricated from FR-4. Board 140 may include any number of conductive layers separated by a non-conductive material, such as a dielectric. In one embodiment, board 140 includes a single conductive layer formed on a dielectric base, such as a layer comprising copper or a copper alloy formed on FR-4.

One or more solder balls 142 mechanically and electrically connect the substrate to board 140. Solder balls 142 are preferably fabricated from a conductive material. In one embodiment, the conductive material is a metal or metal alloy. Metals and metal alloys used in exemplary embodiments of the present invention include aluminum, copper, tin, gold, silver, lead, and alloys of aluminum, copper, tin, gold, silver, or lead. Each of the one or more solder balls 142 has a solder reflow temperature. The solder reflow temperature is the temperature at which each of the one or more solder balls 142 makes a sustainable electrical connection to pads (not shown) on substrate 101 and the electrical connection sites (not shown) on board 140. A sustainable electrical connection is a connection for which small stresses and vibrations at the electrical connection do not interfere electrical conduction at the connection. In one embodiment of the present invention, the solder reflow temperature is between about 183 degrees Centigrade and 280 degrees Centigrade.

FIG. 1F shows a plan view of the package 100 according to an embodiment of the present invention. Package 100 includes a substrate 101, a board-on-chip slot 104, and a plurality of adhesive bumps 105 on the substrate top surface. A die 110 is fixed on the adhesive bumps to the substrate 101. The board-on-chip slot 104 is at least partially covered by the die 110.

FIG. 2A shows a cross-sectional view of another embodiment of an electronic package 100A according to the invention. Another method for depositing underfill material 120A is a "no-flow" process. The adhesive bumps 105 are formed on the substrate as described herein. A no-flow underfill dispenser 200 places no-flow underfill directly on the substrate upper surface 102 and in contact with the adhesive bumps 105. In an embodiment, the substrate upper surface 102 and adhesive bumps 105 are dipped in a no flow underfill bath as described in Patent Application Publication No. US 2002/0025602A1, hereby incorporated by reference. The underfill material 120A has a lower viscosity than the adhesive bumps 105.

Figure 2B:
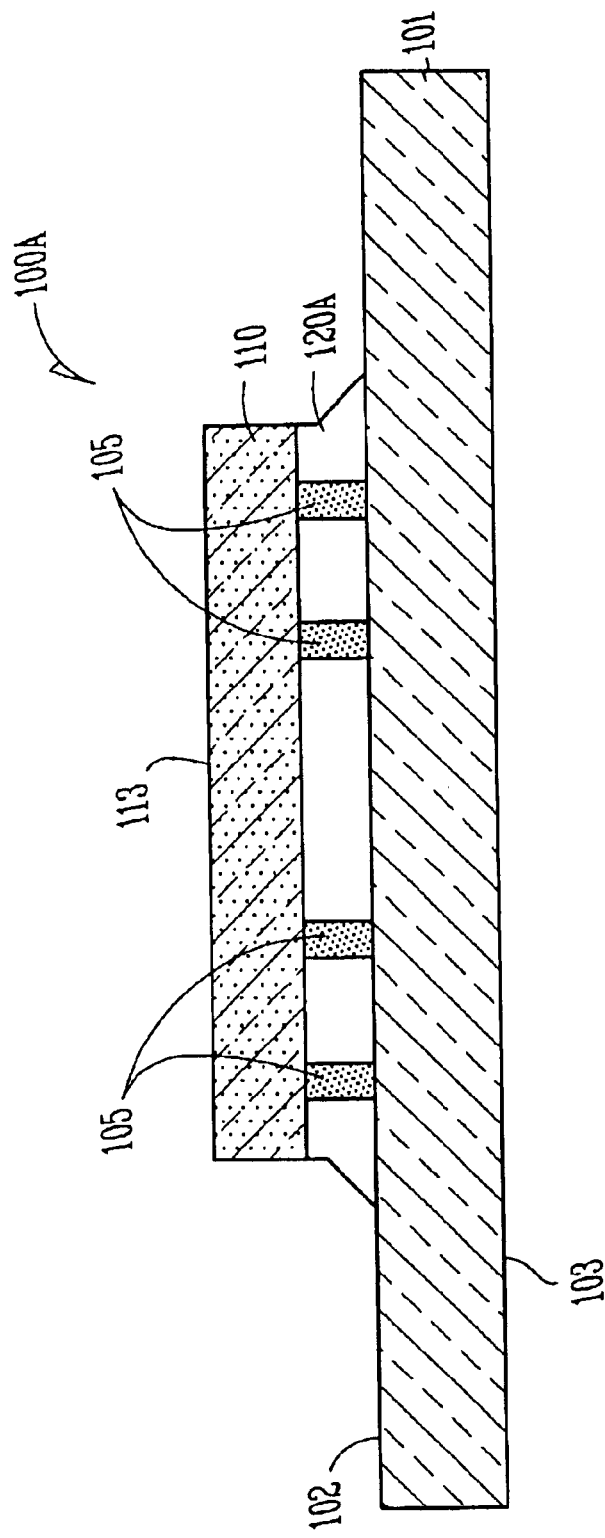
FIG. 2B is cross sectional view another embodiment of an electronic package of the present invention.
Figure 2C:
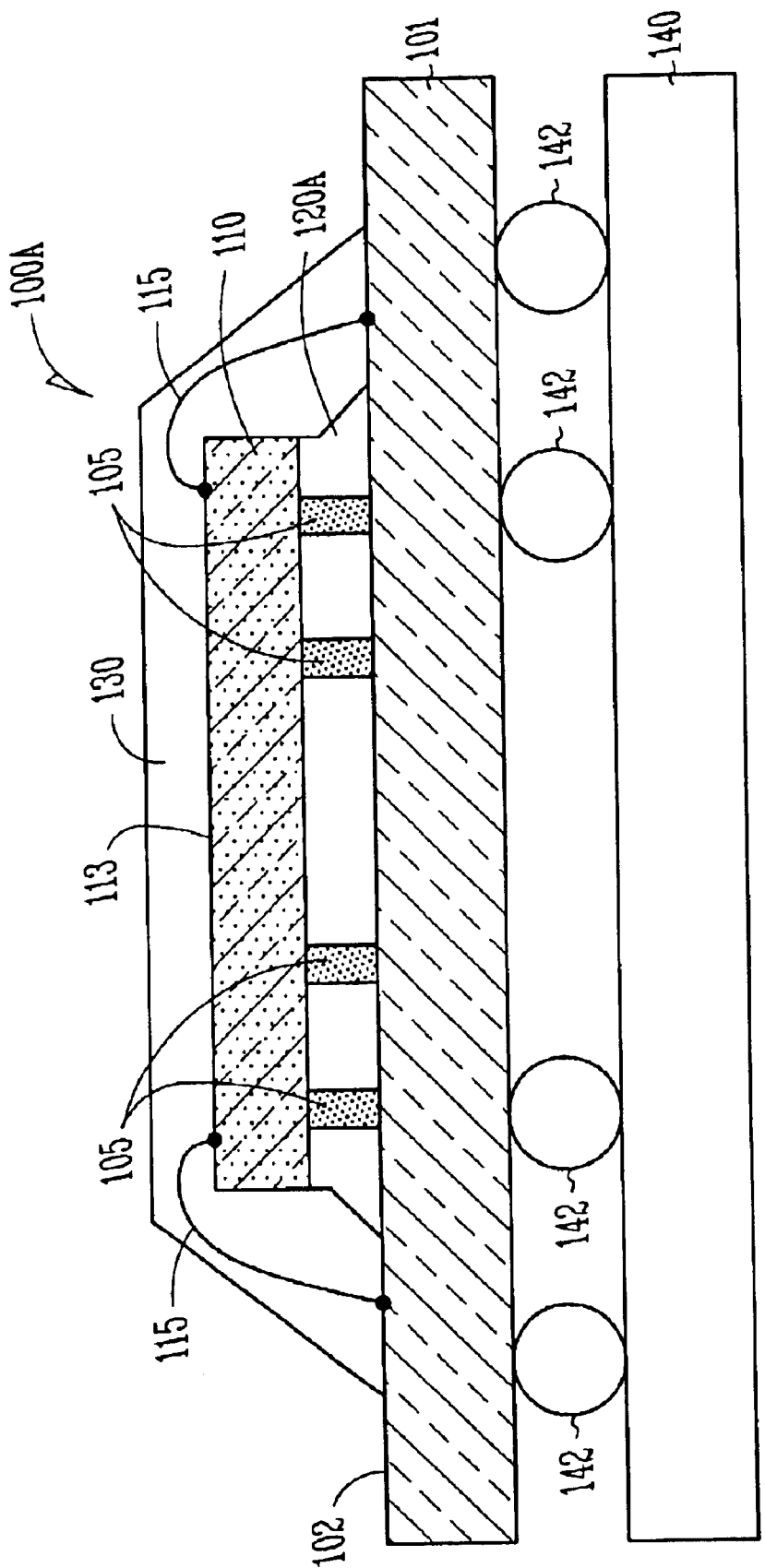
FIG. 2C is cross sectional view another embodiment of an electronic package of the present invention.

FIG. 2B shows a cross-sectional view of the electronic package 100A. Die 110 is placed on the adhesive bumps 105 and underfill material 120A. The adhesive bumps 105 support the die 105. Underfill material 120A substantially fills the entire void 112. The underfill material 120A and adhesive bumps 120A are cured. In an embodiment, the adhesive bumps 105 cross-link to the underfill material 120A. FIG. 2C shows a cross-sectional view of electronic package 100A according to the present invention. Electronic package 100A is similar to the embodiment described above. Package 100A includes substrate 105, die 110, one or more solder balls 142 for electronically coupling substrate 105 to board 140, a plurality of adhesive bumps 105, a die attach material 120A, and molding compound 130. Bonding wires 115 electrically couple a top surface 113 of die 110 to a top surface 102 of substrate 105. Bonding wires 115 extend outwardly along the peripheral edges of the die 110. Die attach material 120A attaches die 110 to the first surface 102 of substrate 105. The die attach material 120A includes materials described above with reference to FIGS. 1A–1F in embodiments of the invention. Electronic package 100A, which includes die attachment material 120A, has the same attachment characteristics as electronic package 100 shown in FIGS. 1A–1F in embodiments of the invention.

Figure 3:
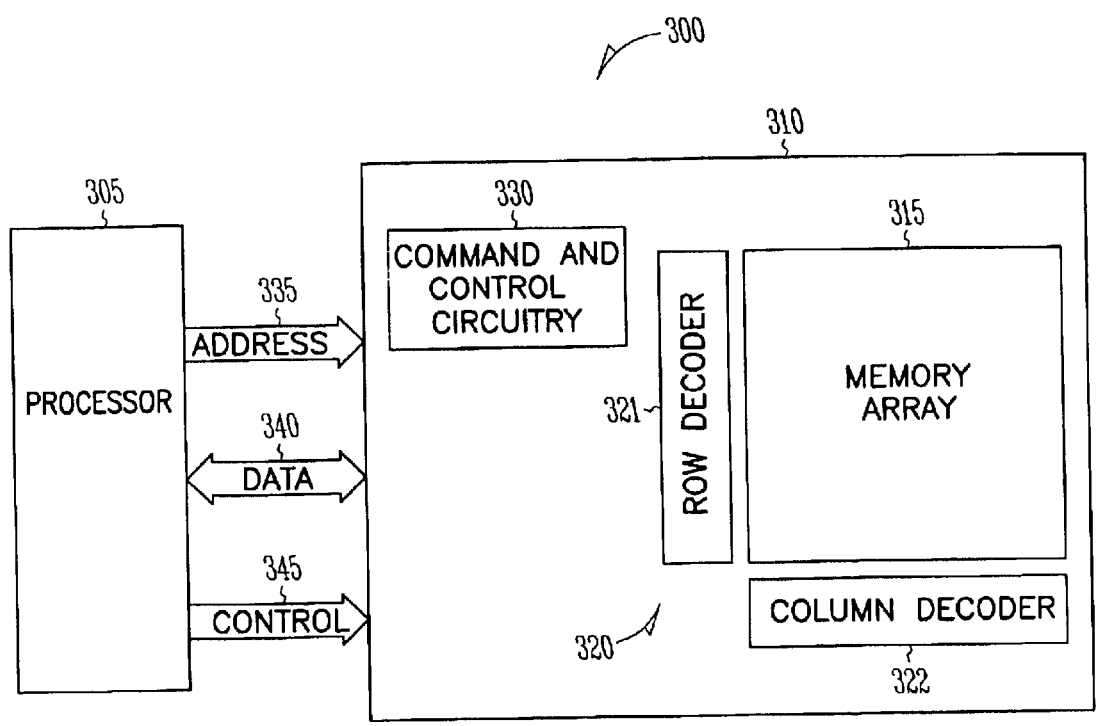
FIG. 3 is a block diagram of one embodiment of an electronic system including a die packaged according to the present invention.

FIG. 3 is a block diagram of a computer system 300 according to the present invention. System 300 includes a processor 305 and memory board assembly 310. Memory board assembly 310 includes a memory array 315, address circuitry 320, and read/write (command and control) circuitry 330. Address circuitry 320, in an embodiment, includes a row decoder 321 and a column decoder 322. An address bus 335 couples processor 305 to memory board assembly 310 and is adapted to deliver memory signals to address circuitry 320. A data bus 340 connects processor 305 to memory board assembly and is adapted to deliver and receive (i.e., bidirectional) data signals to and from the memory board assembly 310. A command and control bus 345 further connects the processor 305 to the memory board assembly 310 and is adapted to deliver command and control signals to command and control circuitry of 330. In one embodiment, the processor 305 is packaged as die 110 in an electronic package as described herein. In another embodiment, the processor and memory are packaged as die 110 in electronic package as described herein. In still another embodiment, the memory array 315 is packaged as die 203 in an electronic package as described herein. Processor 305, through address bus 335, data bus 340, and control bus 345 communicates with memory board assembly 310. In a read operation initiated by processor 305, address information, data information, and control information are provided to memory board assembly 310 through busses 335, 340, and 345. This information is decoded by addressing circuitry 320, including a row decoder and a column decoder, and read circuitry 330. Successful completion of the read operation results in information from memory array 315 being communicated to processor 305 over data bus 340.

Figure 4:
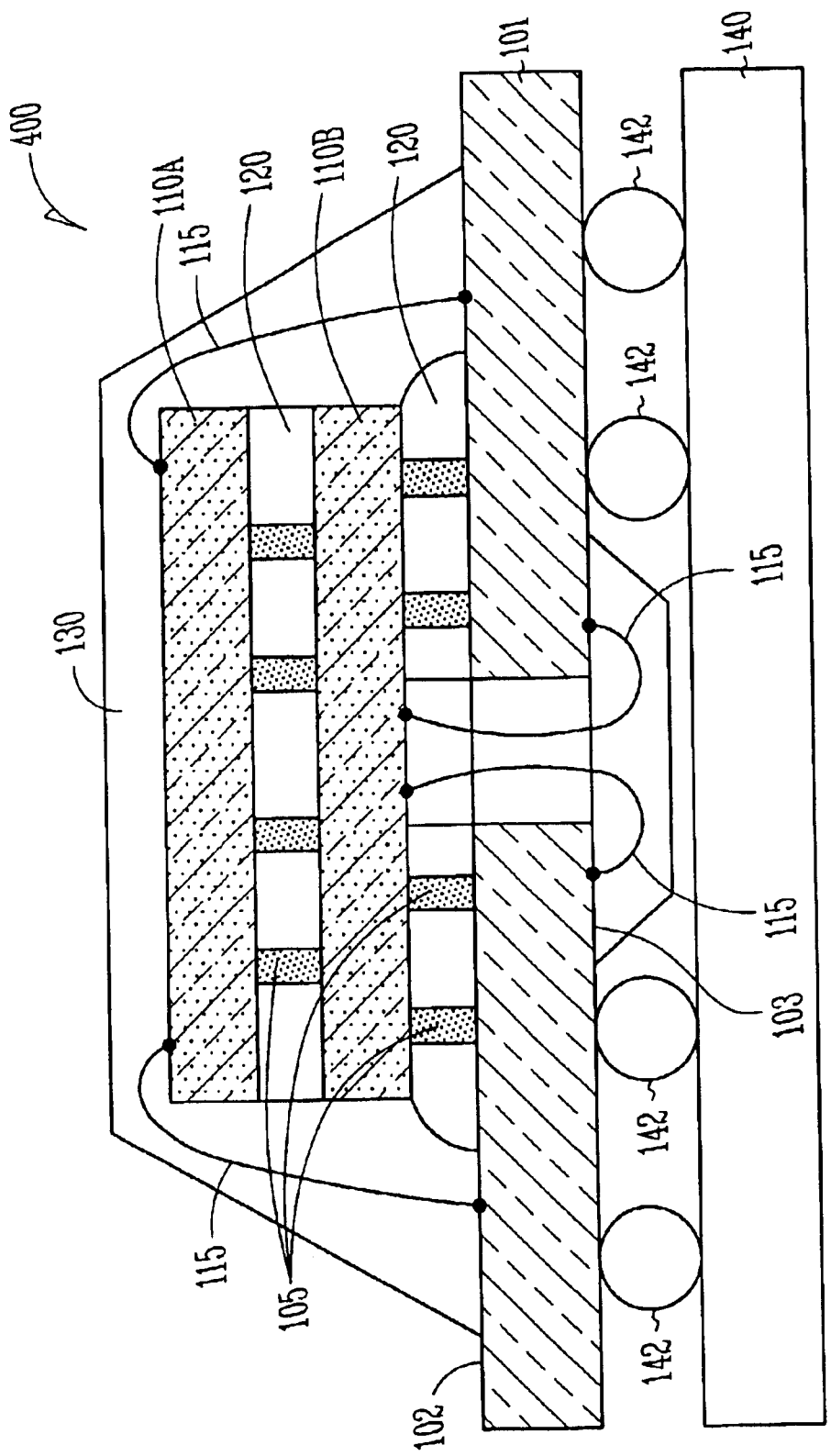
FIG. 4 is a further embodiment of an electronic package according to the present invention.

FIG. 4 shows another embodiment of the present invention that includes a stacked die assembly 400 mounted to substrate 101. Assembly 400 includes a plurality of die 110A and 110B that are fixed together according to the teachings of the present invention. At least one of the die 110A and 110B includes adhesive bumps 105 formed thereon. The adhesive bumps 105 fix the adjacent dies together with an underfill 120 material filling the gap between the die 110A and 110B. The present invention further includes stacking a plurality of dies using adhesive bumps 105 between at least two adjacent dies. In an embodiment, an underfill material fills the gap between at least two adjacent dies. In an embodiment, the stack of die include electrical connections between at least two of the stacked die. The present subject matter further includes a plurality of die that are stacked together and at least one of the stacked die is fixed to the substrate according to the teachings herein. The die, in an embodiment, are connected together using solder connections. The die, in an embodiment, are connected together using an underfill material. In an embodiment, the stacked die are mechanically and electrically connected together. In an embodiment, at least one of the stacked die is electrically connected to the substrate.

CONCLUSION

An electronic device package has been described. In an embodiment, the electronic device package includes a non-metal support attaching the die to and above the substrate. The die support is a die adhesive An underfill material fills the space between the die and substrate. The underfill material includes non-metal materials. Thus, the space between the die and substrate is filled with similar materials, i.e., the support and the underfill. In an embodiment, the support material is an epoxy resin. In an embodiment, the epoxy resin has a high viscosity. This allows the epoxy resin to hold its shape with the die supported thereon. The application of the die adhesive is flexible as to its amount, location, and bond line thickness (the thickness between the die and substrate). Moreover, the die adhesive support and underfill material cross-link such that the material intermediate the die and substrate is essentially homogenous. This eliminates potential unwanted interaction between dissimilar materials. Further, the use of the die adhesive supports and underfill allows the use of a high modulus underfill. For example, the underfill has a modulus that is 100 times the modulus of the die adhesive material. The higher modulus improves the reliability of the assembly. Still further, the use of non-metal material for both the die support and underfill is believed to be more inexpensive than conventional technologies.

The present invention provides advantages over convention tape adhesive technologies for attaching a die to a substrate. The present invention does not require the expensive tooling costs associated tape adhesive technologies.

It will be appreciated that in some embodiments of the invention, the fabrication steps recited herein are performed in the order recited in the attached claims and in the written description.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. An integrated circuit package, comprising:
   a substrate;
   a plurality of adhesive bumps on the substrate, wherein the plurality of adhesive bumps includes an epoxy resin having oxiranes; and
   a die on the plurality of adhesive bumps.

2. The integrated circuit package of claim 1, wherein the plurality of adhesive bumps includes a high viscosity adhesive material.

3. The integrated circuit package of claim 1 wherein the epoxy resin is formed from oxiranes that are identical.

4. The integrated circuit package of claim 1 wherein the epoxy resin is formed from oxiranes that are not identical.

5. The integrated circuit package of claim 1 wherein the epoxy resin is formed from oxiranes that are not identical and the number of different oxirane monomers is from 2 to about 1,000.

6. The integrated circuit package of claim 1 wherein the epoxy resin is formed from oxiranes that are not identical and the number of different oxirane monomers is from 2 to about 100.

7. The integrated circuit package of claim 1 wherein the epoxy resin is formed from oxiranes that are not identical and the number of different oxirane monomers is from 2 to about 10.

8. An integrated circuit package comprising:
   a substrate;
   a plurality of adhesive bumps on the substrate, wherein the plurality of adhesive bumps includes an epoxy resin, wherein the epoxy resin is a mixture of two or more epoxy resins; and
   a die on the plurality of adhesive bumps.

9. An integrated circuit package comprising:
   a substrate;
   a plurality of adhesive bumps on the substrate, wherein the plurality of adhesive bumps includes an epoxy resin, wherein the epoxy resin is a mixture of 2 to about 100 epoxy resins; and
   a die on the plurality of adhesive bumps.

10. An integrated circuit package comprising:
    a substrate;
    a plurality of adhesive bumps on the substrate, wherein the plurality of adhesive bumps includes an epoxy resin, wherein the epoxy resin is a mixture of 2 to about 50 epoxy resins; and
    a die on the plurality of adhesive bumps.

11. An integrated circuit package comprising:
    a substrate;
    a plurality of adhesive bumps on the substrate, wherein the plurality of adhesive bumps includes an epoxy resin, wherein the epoxy resin is a mixture of 2 to about 10 epoxy resins; and
    a die on the plurality of adhesive bumps.

12. The integrated circuit package of claim 1 wherein the epoxy resin is polymerized from one or more oxiranes under basic conditions.

13. The integrated circuit package of claim 1 wherein the epoxy resin is polymerized from one or more oxiranes under acidic conditions.

14. The integrated circuit package of claim 1 wherein the epoxy resin is polymerized from one or more oxiranes under basic or acidic conditions and further includes a solidifier, a catalyst, or a combination thereof.

15. The integrated circuit package of claim 1 wherein the epoxy resin is polymerized from one or more oxiranes under basic or acidic conditions and further includes bisphenol A, bisphenol F, methyl hexahydrophthalic anhydride, silica, carbon black, CTBN or a combination thereof.

16. An integrated circuit package comprising:
    a substrate;
    a plurality of adhesive bumps on the substrate, wherein the plurality of adhesive bumps includes an epoxy resin, wherein the epoxy resin comprises about 2 to about 1,000,000 monomers formed from the oxirane; and
    a die on the plurality of adhesive bumps.

17. An integrated circuit package comprising:
    a substrate;
    a plurality of adhesive bumps on the substrate, wherein the plurality of adhesive bumps includes an epoxy resin, wherein the epoxy resin comprises about 2 to about 100,000 monomers formed from the oxirane; and
    a die on the plurality of adhesive bumps.

18. An integrated circuit package comprising:
    a substrate;
    a plurality of adhesive bumps on the substrate, wherein the plurality of adhesive bumps includes an epoxy resin, wherein the epoxy resin comprises about 2 to about 50,000 monomers formed from the oxirane; and
    a die on the plurality of adhesive bumps.

19. An integrated circuit package comprising:
    a substrate;
    a plurality of adhesive bumps on the substrate, wherein the plurality of adhesive bumps includes an epoxy resin, wherein the epoxy resin comprises about 2 to about 10,000 monomers formed from the oxirane; and
    a die on the plurality of adhesive bumps.

20. The integrated circuit package of claim 1 wherein the epoxy resin is formed at room temperature.

21. The integrated circuit package of claim 1 wherein the epoxy resin is formed at an elevated temperature.

22. The integrated circuit package of claim 1 wherein the epoxy resin is formed at a temperature above about 77° F. (25° C.).

23. The integrated circuit package of claim 1 wherein the epoxy resin is formed at a pressure above about 1 atm. (14.7 psi).

24. The integrated circuit package of claim 1 wherein the epoxy resin is formed via the use of radiant energy.

25. The integrated circuit package of claim 1 wherein the epoxy resin is formed via the use of UV, electron beam, microwave, beta radiation, gamma radiation, neutron beam, proton beam, infra red, or a combination thereof.

26. The integrated circuit package of claim 1, wherein the substrate includes a printed circuit board.

27. The integrated circuit package of claim 1, wherein the substrate includes a glass-epoxy resin substrate.

28. The integrated circuit package of claim 1, wherein the die includes a memory circuit.

29. An integrated circuit package, comprising:
    a substrate;
    a plurality of adhesive bumps on the substrate;
    a die on the plurality of adhesive bumps; and
    wherein the plurality of adhesive bumps contact less than about 30% of the surface area of the die.

30. An integrated circuit package, comprising:
    a substrate;

a plurality of adhesive bumps on the substrate;

a die on the plurality of adhesive bumps; and wherein the plurality of adhesive bumps contact less than about 50% of the surface area of the die.

31. The integrated circuit package of claim 1, wherein the plurality of adhesive bumps stand upright from a surface of the substrate and separate the die from the substrate.

32. An integrated circuit package comprising:

a substrate;

a plurality of adhesive bumps on the substrate, wherein the plurality of adhesive bumps includes an epoxy resin having oxiranes;

a die on the plurality of adhesive bumps and spaced from the substrate; and an underfill material in the space between the substrate and the die.

33. The integrated circuit package of claim 32, wherein the plurality of adhesive bumps includes a high viscosity adhesive material.

34. The integrated circuit package of claim 32, wherein the underfill material includes a epoxy encapsulant.

35. An integrated circuit package, comprising:

a substrate;

a plurality of adhesive bumps on the substrate;

a die on the plurality of adhesive bumps and spaced from the substrate; and an underfill material in the space between the substrate and the die, wherein the underfill material has a lower viscosity than the plurality of adhesive bumps.

36. The integrated circuit package of claim 35, wherein the underfill material has a viscosity of about 2,800 mPa s.

37. The integrated circuit package of claim 32, wherein the substrate includes a first surface, the die includes a second surface, the first surface faces the second surface, and wherein the underfill material contacts both the first surface and the second surface.

38. An integrated circuit package, comprising:

a substrate;

a plurality of adhesive bumps on the substrate;

a die on the plurality of adhesive bumps and spaced from the substrate; and an underfill material in the space between the substrate and the die, wherein the plurality of adhesive bumps have a Young's modulus, and wherein the underfill material includes a Young's modulus that is an order of magnitude greater than the Young's modulus of the plurality of adhesive bumps.

39. An integrated circuit package, comprising:

a substrate;

a plurality of adhesive bumps on the substrate;

a die on the plurality of adhesive bumps and spaced from the substrate;

an underfill material in the space between the substrate and the die, wherein the underfill material cross-links to the plurality of adhesive bumps; and wherein the underfill material has a lower viscosity than the plurality of adhesive bumps.

40. The integrated circuit package of claim 39, wherein the underfill material has a viscosity of about 2,800 mPa s.

41. The integrated circuit package of claim 39, wherein the adhesive bumps include an epoxy resin.

42. An integrated circuit package comprising:

a substrate;

a plurality of adhesive bumps on the substrate, wherein the plurality of adhesive bumps includes an epoxy resin having oxiranes;

a die on the plurality of adhesive bumps and spaced from the substrate; and an underfill material in the space between the substrate and the die, wherein the underfill material connects to the plurality of adhesive bumps to form a continuous material layer between the substrate and the die.

43. The integrated circuit package of claim 42, wherein the underfill material includes an epoxy resin.

44. An integrated circuit package, comprising:

a substrate;

a plurality of adhesive bumps on the substrate;

a die on the plurality of adhesive bumps and spaced from the substrate;

an underfill material in the space between the substrate and the die, wherein the underfill material connects to the plurality of adhesive bumps to form a continuous material layer between the substrate and the die; and wherein the underfill material has a lower viscosity than the plurality of adhesive bumps.

45. An integrated circuit package, comprising:

a substrate;

a plurality of adhesive bumps on the substrate;

a die on the plurality of adhesive bumps and spaced from the substrate;

an underfill material in the space between the substrate and the die, wherein the underfill material connects to the plurality of adhesive bumps to form a continuous material layer between the substrate and the die; and wherein the underfill material has a viscosity of about 2,800 mPa s.

46. An electronic device package, comprising:

a substrate;

a plurality of adhesive bumps on the substrate;

a die on the plurality of adhesive bumps and spaced from the substrate;

an underfill material in the space between the substrate and the die, wherein the underfill material has a lower viscosity than the plurality of adhesive bumps;

an electrical connection between the die and the substrate; and wherein the plurality of adhesive bumps contact less than about 50% of the surface area of the die.

47. The package of claim 46, wherein the underfill material connects to the plurality of adhesive bumps to form a continuous material layer between the substrate and the die.

48. The package of claim 46, wherein the underfill material cross-links to the plurality of adhesive bumps to form a continuous material layer between the substrate and the die.

49. The package of claim 46, wherein the adhesive bumps extend upwardly from the substrate first surface to space the die from the substrate first surface.

50. The package of claim 46, wherein the electrical connection includes at least one wire bond.

51. The package of claim 46, wherein the underfill material and the adhesive bumps include an epoxy resin.

52. An electronic package, comprising:

a substrate having a first surface, a second surface, and a first contact;

a plurality of adhesive bumps on the substrate first surface;

a die on the plurality of adhesive bumps and spaced from the substrate, the die including a first surface opposing the substrate first surface, a second surface, and a second contact;

an underfill material in the space between the substrate first surface and the die first surface, wherein the underfill material has a lower viscosity than the plurality of adhesive bumps;

an electrical connection between the first contact and the second contact; and wherein the plurality of adhesive bumps contact less than about 30% of the surface area of the die.

53. The package of claim 52, wherein the underfill material cross-links to the plurality of adhesive bumps to form a continuous material layer between the substrate and the die.

54. The package of claim 52, wherein the adhesive bumps extend upwardly from the substrate first surface to space the die from the substrate first surface.

55. The package of claim 52, wherein the electrical connection includes at least one wire bond.

56. The package of claim 52, wherein the underfill material and the adhesive bumps include an epoxy resin.

57. The package of claim 52, wherein the substrate includes a slot, and the electrical connection extends through the slot.

58. The package of claim 52, wherein the first contact is on the substrate second surface, and wherein the second contact is on the die first surface.

59. The package of claim 58, wherein the electrical connection includes a wire bond.

60. The package of claim 52, wherein the first contact is on the substrate first surface, and wherein the second contact is on the die second surface.

61. The package of claim 60, wherein the electrical connection includes a wire bond.

62. An integrated circuit package, comprising:
a substrate;
a plurality of adhesive bumps on the substrate;
a die on the plurality of adhesive bumps and spaced from the substrate;
an underfill material in the space between the substrate and the die; and
wherein the underfill material includes 1,6-Bis(2,3-epoxypropoxy) naphthalene; methyl hexahydrophthalic anhydride; silica; and carbon black.

63. The integrated circuit package of claim 8, wherein the epoxy resin is formed at an elevated temperature.

64. The integrated circuit package of claim 8, wherein the epoxy resin is formed at a temperature above about 77° F. (25° C.).

65. The integrated circuit package of claim 64, wherein the epoxy resin is formed at a pressure above about 1 atm. (14.7 psi).

66. The integrated circuit package of claim 8, wherein the epoxy resin is formed from oxiranes that are identical.

67. The integrated circuit package of claim 8, wherein the epoxy resin is formed from oxiranes that are not identical.

68. The integrated circuit package of claim 8, wherein the epoxy resin is formed from oxiranes that are not identical and the number of different oxirane monomers is from 2 to about 1,000.

69. The integrated circuit package of claim 8, wherein the epoxy resin is formed from oxiranes that are not identical and the number of different oxirane monomers is from 2 to about 100.

70. The integrated circuit package of claim 8, wherein the epoxy resin is formed from oxiranes that are not identical and the number of different oxirane monomers is from 2 to about 10.

71. The integrated circuit package of claim 8, wherein the plurality of adhesive bumps contact less than about 30% of the surface area of the die.

72. The integrated circuit package of claim 8, wherein the plurality of adhesive bumps contact less than about 50% of the surface area of the die.

73. The integrated circuit package of claim 9, wherein the epoxy resin is formed at an elevated temperature.

74. The integrated circuit package of claim 9, wherein the epoxy resin is formed at a temperature above about 77° F. (25° C.).

75. The integrated circuit package of claim 74, wherein the epoxy resin is formed at a pressure above about 1 atm. (14.7 psi).

76. The integrated circuit package of claim 9, wherein the epoxy resin is formed from oxiranes that are identical.

77. The integrated circuit package of claim 9, wherein the epoxy resin is formed from oxiranes that are not identical.

78. The integrated circuit package of claim 9, wherein the epoxy resin is formed from oxiranes that are not identical and the number of different oxirane monomers is from 2 to about 1,000.

79. The integrated circuit package of claim 9, wherein the epoxy resin is formed from oxiranes that are not identical and the number of different oxirane monomers is from 2 to about 100.

80. The integrated circuit package of claim 9, wherein the epoxy resin is formed from oxiranes that are not identical and the number of different oxirane monomers is from 2 to about 10.

81. The integrated circuit package of claim 9, wherein the plurality of adhesive bumps contact less than about 30% of the surface area of the die.

82. The integrated circuit package of claim 9, wherein the plurality of adhesive bumps contact less than about 50% of the surface area of the die.

83. The integrated circuit package of claim 10, wherein the epoxy resin is formed at an elevated temperature.

84. The integrated circuit package of claim 10, wherein the epoxy resin is formed at a temperature above about 77° F. (25° C.).

85. The integrated circuit package of claim 10, wherein the epoxy resin is formed at a pressure above about 1 atm. (14.7 psi).

86. The integrated circuit package of claim 10, wherein the epoxy resin is formed from oxiranes that are identical.

87. The integrated circuit package of claim 10, wherein the epoxy resin is formed from oxiranes that are not identical.

88. The integrated circuit package of claim 10, wherein the epoxy resin is formed from oxiranes that are not identical and the number of different oxirane monomers is from 2 to about 1,000.

89. The integrated circuit package of claim 10, wherein the epoxy resin is formed from oxiranes that are not identical and the number of different oxirane monomers is from 2 to about 100.

90. The integrated circuit package of claim 10, wherein the epoxy resin is formed from oxiranes that are not identical and the number of different oxirane monomers is from 2 to about 10.

91. The integrated circuit package of claim 10, wherein the plurality of adhesive bumps contact less than about 30% of the surface area of the die.

92. The integrated circuit package of claim 10, wherein the plurality of adhesive bumps contact less than about 50% of the surface area of the die.

93. The integrated circuit package of claim 11, wherein the epoxy resin is formed at an elevated temperature.

94. The integrated circuit package of claim 11, wherein the epoxy resin is formed at a temperature above about 77° F. (25° C.).

95. The integrated circuit package of claim 11, wherein the epoxy resin is formed at a pressure above about 1 atm. (14.7 psi).

96. The integrated circuit package of claim 11, wherein the epoxy resin is formed from oxiranes that are identical.

97. The integrated circuit package of claim 11, wherein the epoxy resin is formed from oxiranes that are not identical.

98. The integrated circuit package of claim 11, wherein the epoxy resin is formed from oxiranes that are not identical and the number of different oxirane monomers is from 2 to about 1,000.

99. The integrated circuit package of claim 11, wherein the epoxy resin is formed from oxiranes that are not identical and the number of different oxirane monomers is from 2 to about 100.

100. The integrated circuit package of claim 11, wherein the epoxy resin is formed from oxiranes that are not identical and the number of different oxirane monomers is from 2 to about 10.

101. The integrated circuit package of claim 11, wherein the plurality of adhesive bumps contact less than about 30% of the surface area of the die.

102. The integrated circuit package of claim 11, wherein the plurality of adhesive bumps contact less than about 50% of the surface area of the die.

103. The integrated circuit package of claim 35, wherein the plurality of adhesive bumps includes a high viscosity adhesive material.

104. The integrated circuit package of claim 35, wherein the underfill material includes a epoxy encapsulant.

105. The integrated circuit package of claim 35, wherein the substrate includes a first surface, the die includes a second surface, the first surface faces the second surface, and wherein the underfill material contacts both the first surface and the second surface.

106. The integrated circuit package of claim 35, wherein the plurality of adhesive bumps have a Young's modulus, and wherein the underfill material includes a Young's modulus that is an order of magnitude greater than the Young's modulus of the plurality of adhesive bumps.

107. The integrated circuit package of claim 29, wherein the die includes a memory circuit.

108. The integrated circuit package of claim 107, wherein the memory circuit include a random access memory device.

109. The integrated circuit package of claim 62, wherein the underfill material has a lower viscosity than the plurality of adhesive bumps.

110. The integrated circuit package of claim 62, wherein the underfill material has a viscosity of about 2,800 mPa s.

111. The integrated circuit package of claim 62, wherein the plurality of adhesive bumps have a Young's modulus, and wherein the underfill material includes a Young's modulus that is an order of magnitude greater than the Young's modulus of the plurality of adhesive bumps.

112. The integrated circuit package of claim 62, wherein the plurality of adhesive bumps contact less than about 30% of the surface area of the die.

113. The integrated circuit package of claim 62, wherein the plurality of adhesive bumps contact less than about 50% of the surface area of the die.

114. The integrated circuit package of claim 62, wherein the substrate includes a glass-epoxy resin substrate.

115. The package of claim 46, wherein the underfill material includes 1,6-Bis(2,3-epoxypropoxy) naphthalene; methyl hexahydrophthalic anhydride; silica; and carbon black.

* * * * *

UNITED STATES PATENT AND TRADEMARK OFFICE
CERTIFICATE OF CORRECTION

PATENT NO. : 6,969,914 B2
DATED : November 29, 2005
INVENTOR(S) : Fuller et al.

It is certified that error appears in the above-identified patent and that said Letters Patent is hereby corrected as shown below:

Title page,
Item [56], References Cited, U.S. PATENT DOCUMENTS, delete "Tonghi et al." and insert -- Jiang et al. --;
OTHER PUBLICATIONS,
"Nagase Chemtex Corp", reference, delete "Chemtex" and insert -- ChemteX --.

Column 5,
Line 11, after "nitro," delete "$(C_{1-C24})$" and insert -- $(C_1-C_{24})$ --.
Line 12, delete "$(C_{2-C24})$alkenyl" and insert -- $(C_2-C_{24})$alkenyl --.

Signed and Sealed this

Twenty-eighth Day of February, 2006

JON W. DUDAS
*Director of the United States Patent and Trademark Office*